(12) United States Patent
Lee

(10) Patent No.: US 9,053,814 B2
(45) Date of Patent: Jun. 9, 2015

(54) VOLTAGE GENERATORS ADAPTIVE TO LOW EXTERNAL POWER SUPPLY VOLTAGE

(71) Applicant: Dong-Su Lee, Hwaseong-si (KR)

(72) Inventor: Dong-Su Lee, Hwaseong-si (KR)

(73) Assignee: SAMSUNG ELECTRONICS CO., LTD., Yeongtong-gu, Suwon-si, Gyeonggi-do (KR)

( * ) Notice: Subject to any disclaimer, the term of this patent is extended or adjusted under 35 U.S.C. 154(b) by 274 days.

(21) Appl. No.: 13/661,297

(22) Filed: Oct. 26, 2012

(65) Prior Publication Data

US 2013/0223175 A1    Aug. 29, 2013

(30) Foreign Application Priority Data

Feb. 27, 2012   (KR) .......................... 10-2012-0019832

(51) Int. Cl.
| | | |
|---|---|---|
| *G11C 7/00* | (2006.01) | |
| *G11C 11/4076* | (2006.01) | |
| *G05F 1/56* | (2006.01) | |
| *G11C 11/4074* | (2006.01) | |
| *H02M 3/07* | (2006.01) | |
| *G11C 11/4099* | (2006.01) | |
| *G11C 5/14* | (2006.01) | |

(52) U.S. Cl.
CPC .............. *G11C 11/4076* (2013.01); *G05F 1/56* (2013.01); *G11C 11/4074* (2013.01); *H02M 3/07* (2013.01); *G11C 11/4099* (2013.01); *G11C 2207/2272* (2013.01); *G11C 5/145* (2013.01); *G11C 5/147* (2013.01)

(58) Field of Classification Search
USPC ............................ 365/228, 189.09, 189.11
See application file for complete search history.

(56) References Cited

U.S. PATENT DOCUMENTS

| | | | |
|---|---|---|---|
| 5,757,226 A | 5/1998 | Yamada et al. | |
| 5,783,935 A * | 7/1998 | Kyung | ............................ 323/313 |
| 6,348,886 B1 * | 2/2002 | Frank et al. | .................... 341/144 |
| 7,002,330 B2 * | 2/2006 | Kitani et al. | .................... 323/284 |

FOREIGN PATENT DOCUMENTS

| | | |
|---|---|---|
| JP | 1999-328954 | 11/1999 |
| JP | 2000-243081 | 9/2000 |
| KR | 1996-0023685 | 6/1996 |
| KR | 1996-0029152 | 7/1996 |
| KR | 1996-0040693 | 9/1996 |
| KR | 1997-0010496 | 3/1997 |
| KR | 1997-0057743 | 11/1997 |
| KR | 10-0205546 B1 | 4/1999 |
| KR | 1999-0015338 | 4/1999 |
| KR | 2003-0021916 | 4/2003 |

(Continued)

*Primary Examiner* — Son Dinh
(74) *Attorney, Agent, or Firm* — Muir Patent Law, PLLC

(57) ABSTRACT

Voltage generators may generate a level of a high target voltage with respect to a low external power supply voltage. A reference voltage generator includes a clamp regulator which is driven by a first power supply voltage supplied from an external source and receives a first voltage to generate a clamp voltage, and a level amplifier which is driven by a second power supply voltage that is higher than the first power supply voltage and receives the clamp voltage to generate a reference voltage. The clamp voltage may be set to have a voltage level which results in a successful restore operation with respect to a memory cell array in a dynamic random access memory (DRAM).

23 Claims, 12 Drawing Sheets

(56) References Cited

FOREIGN PATENT DOCUMENTS

| KR | 2009-0103118 | 10/2009 |
| KR | 2010-0135062 | 12/2010 |

\* cited by examiner

VOLTAGE GENERATORS ADAPTIVE TO LOW EXTERNAL POWER SUPPLY VOLTAGE

CROSS-REFERENCE TO RELATED APPLICATIONS

This application claims the benefit of Korean Patent Application No. 10-2012-0019832, filed on Feb. 27, 2012, in the Korean Intellectual Property Office, the disclosure of which is incorporated herein in its entirety by reference.

BACKGROUND

The present disclosure relates to a semiconductor memory device, and more particularly, to voltage generators which generate internal voltages of a specific level even at a low external power supply voltage, and a semiconductor memory device and a memory system which include the voltage generators.

An operating environment of a semiconductor memory device tends to reduce power consumption by using a low operating voltage. The semiconductor memory device may be designed to be driven by an internal voltage which is voltage-dropped from a voltage provided from an external source. With the low power-consumption trend of semiconductor memory devices, the level of an external power supply voltage, which is an operating voltage, is being further lowered. Due to the external power supply voltage of a lowered level, the level of an internal voltage is also further lowered. If the level of the internal voltage is lowered below a target voltage, the operating characteristics of the semiconductor memory device may be deteriorated.

SUMMARY

The disclosed embodiments provide voltage generators which generate a reference voltage of a specific level and an internal power supply voltage of a specific level even at a low external power supply voltage, and a semiconductor memory device and a memory system which include the voltage generators.

According to one embodiment, there is provided a reference voltage generator including a clamp regulator which is driven by a first power supply voltage supplied from an external source and receives a first voltage to generate a clamp voltage, and a level amplifier which is driven by a second power supply voltage that is higher than the first power supply voltage and receives the clamp voltage to generate a reference voltage.

The reference voltage generator may be included in a dynamic random access memory (DRAM), and the clamp voltage may be set to have a voltage level which results in a successful restore operation with respect to memory cell data in the DRAM.

The clamp regulator may include a first comparing unit which is driven by the first power supply voltage and is configured to compare the first voltage with a voltage of a first node and to output a voltage of a second node, a first switching unit which is driven by the first power supply voltage and is configured to output the clamp voltage in response to the voltage of the second node, and a first level control unit configured to output the voltage of the first node having the same level as a level of the first voltage and to regulate a level of the clamp voltage.

The first switching unit may be a p-channel metal-oxide semiconductor (PMOS) transistor in which the first power supply voltage is connected to a source, the second node is connected to a gate, and the clamp voltage is connected to a drain.

The first level control unit may include a first resistor connected between the clamp voltage and the second node and a second resistor connected between the second node and a ground voltage.

The level amplifier may include a second comparing unit which is driven by the second power supply voltage and compares the clamp voltage with a voltage of a third node to output a voltage of a fourth node, a second switching unit which is driven by the second power supply voltage and outputs the reference voltage in response to the voltage of the fourth node, and a second level control unit for outputting the voltage of the third node having the same level as a level of the clamp voltage and regulating a level of the reference voltage.

The second switching unit may be a p-channel metal-oxide semiconductor (PMOS) transistor in which the second power supply voltage is connected to a source, the fourth node is connected to a gate, and the reference voltage is connected to a drain.

The second level control unit may include a third resistor connected between the reference voltage and the third node and a fourth resistor connected between the third node and the ground voltage.

The reference voltage generator may further include a charge pumping unit configured to receive the first power supply voltage and output the second power supply voltage through a charge pumping operation.

The reference voltage generator may further include a voltage dropping unit configured to receive a third power supply voltage that is higher than the first power supply voltage and drop the third power supply voltage to output the second power supply voltage.

According to another aspect of the disclosed embodiments, there is provided a dynamic random access memory (DRAM) to which a first power supply voltage is supplied from an external source, the DRAM including a comparing unit which is driven by a second power supply voltage that is higher than the first power supply voltage and configured to compare a first voltage with a voltage of a first node to generate a voltage at a second node, a switching unit which is driven by the second power supply voltage and is configured to output a reference voltage in response to the voltage of the second node, and a level control unit configured to output the voltage of the first node having the same level as a level of the first voltage and to regulate a level of the reference voltage, in which the first voltage is set to have a voltage level which results in a successful restore operation with respect to memory cell data in the DRAM.

According to another embodiment, there is provided a dynamic random access memory (DRAM) to which a first power supply voltage is supplied from an external source, the DRAM including a voltage divider configured to divide a voltage between a first power supply voltage and a ground voltage to generate a clamp voltage, and a level amplifier which is driven by a second power supply voltage that is higher than the first power supply voltage and is configured to receive the clamp voltage to generate a reference voltage, in which the clamp voltage is set to have a minimum voltage level which results in a successful restore operation with respect to memory cell data in the DRAM.

According to another embodiment, there is provided a semiconductor memory device including a first reference voltage generator configured to receive a first power supply voltage supplied from an external source and to generate a first reference voltage, a second reference voltage generator which is driven by a second power supply voltage that is higher than the first power supply voltage and is configured to receive the first reference voltage to generate a clamp voltage and a second reference voltage, and an internal voltage generator which is driven by the second power supply voltage and is configured to receive the second reference voltage to generate an internal power supply voltage.

BRIEF DESCRIPTION OF THE DRAWINGS

Exemplary embodiments will be more clearly understood from the following detailed description taken in conjunction with the accompanying drawings in which.

DETAILED DESCRIPTION

Figure 1:
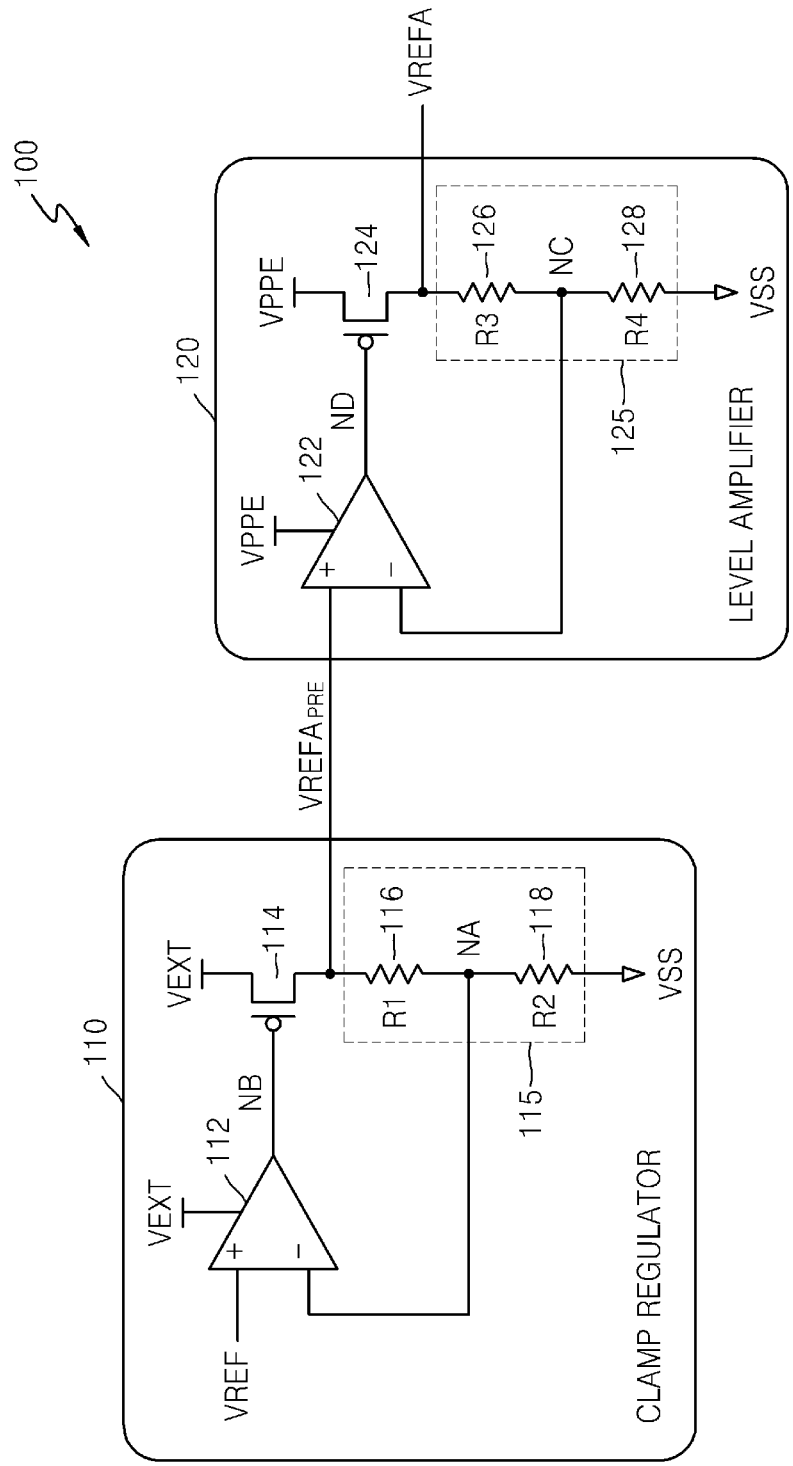
FIG. 1 is a diagram for describing a reference voltage generator according to a first exemplary embodiment of the inventive concept.

Hereinafter, embodiments will be described with reference to the accompanying drawings. The embodiments are provided to more completely describe the disclosure to those of average knowledge in the art. Various changes may be made to the disclosed embodiments, and the disclosed embodiments may have various forms, though certain exemplary embodiments will be illustrated in the drawings and described in detail. These embodiments are not intended to limit the inventive concept, and it should be understood that the embodiments include all changes, equivalents, and substitutes within the spirit and scope of the inventive concept. Throughout the drawings, like reference numerals refer to like components. In the accompanying drawings, structures may be illustrated as enlarged or exaggerated for clarity.

The terminology used herein is for the purpose of describing the disclosure only and is not intended to be limiting. As used herein, the singular forms are intended to include the plural forms as well, unless the context clearly indicates otherwise. It will be further understood that the terms "comprises," "includes," and/or "has" when used in this specification, specify the presence of stated feature, number, step, operation, component, element, or a combination thereof but do not preclude the presence or addition of one or more other features, numbers, steps, operations, components, elements, or combinations thereof.

It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. Unless indicated otherwise, these terms are only used to distinguish one element from another. For example, a first chip could be termed a second chip, and, similarly, a second chip could be termed a first chip without departing from the teachings of the disclosure.

The terms used herein, including technical and scientific terms, have the same meanings as terms that are generally understood by those skilled in the art, as long as the terms are differently defined. It should be understood that terms defined in a generally-used dictionary have meanings coinciding with those of terms in the related technology. As long as the terms are not expressly defined, they should not be ideally or excessively analyzed as formal meanings.

A semiconductor memory device may include an internal voltage down-converter which generates an internal power supply voltage AIVC from an external power supply voltage VEXT. When the semiconductor memory device is implemented as a dynamic random access memory (DRAM), the internal power supply voltage AIVC may be used as a power supply voltage of a core block that includes a DRAM cell array.

Among operating characteristics of the DRAM, a refresh time may be proportional to the amount of charge stored in a cell node. The cell node refers to a node between a DRAM cell transistor and a cell capacitor. The amount of charge stored in the cell node, Q, is proportional to a cell capacitance C based on Q=CV, and is proportional to an internal voltage IVC which is a stored voltage V. As the size of a cell capacitor decreases due to segmentation of a semiconductor manufacturing process, a cell capacitance also decreases. In such circumstances where the cell capacitance decreases, to secure a refresh time, the level of the internal power supply voltage AIVC needs to be high. The refresh time may be maintained at a particular desired level when the internal power supply voltage AIVC is maintained constant at a target voltage level, regardless of the level of the external power supply voltage VEXT.

The internal power supply voltage AIVC is typically generated by being voltage-dropped from the external power supply voltage VEXT. With the low-power consumption trend of the DRAM, the level of the external power supply voltage VEXT is lowered. The lowered level of the external power supply voltage VEXT may be lower than the target voltage level of the internal power supply voltage AIVC. In this case, due to the lowered-level external power supply voltage VEXT, the internal power supply voltage AIVC may be generated to have a lower level than the target voltage level. Because of the internal power supply voltage AIVC of a level that is lower than the target voltage level, the refresh time of the DRAM is difficult to secure. Accordingly, there is a need for voltage generators capable of maintaining the target voltage level of the internal power supply voltage AIVC constant even when the level of the external power supply voltage VEXT is lowered.

FIG. 1 is a diagram for describing a reference voltage generator 100 according to an exemplary embodiment.

Referring to FIG. 1, the reference voltage generator 100 may include a clamp regulator 110 and a level amplifier 120. The clamp regulator 110 is driven by a first power supply voltage VEXT and receives a first voltage VREF to generate a clamp voltage $VREFA_{PRE}$. The first external power supply voltage VEXT may be an external power supply voltage, for example received from a voltage source external to a semiconductor memory device. The level amplifier 120 is driven by a second power supply voltage VPPE and receives the clamp voltage $VREFA_{PRE}$ to generate a reference voltage VREFA. The second power supply voltage VPPE may be set to have a higher level than the first power supply voltage VEXT. The second power supply voltage VPPE may also be an external power supply voltage.

The clamp regulator 110 may be a voltage regulator circuit that includes a first comparing unit 112, a first switching unit 114, and a first level control unit 115. The first comparing unit 112 is driven by the first power supply voltage VEXT and compares the first voltage VREF with a voltage of a first node NA to output a voltage of a second node NB. The first power supply voltage VEXT may be, for example, about 1.2 V. The first voltage VREF may be, for example, about 0.75 V. The first comparing unit 112 may output a logic-low level to the second node NB if the voltage of the first node NA is lower than the first voltage VREF. The first comparing unit 112 may output a logic high level to the second node NB if the voltage of the first node NA is higher than the first voltage VREF. The first comparing unit 112 may include circuit elements that form a comparator, and thus may be referred to herein as a comparator circuit. The second node NB may be connected with the first switching unit 114.

The first switching unit 114 may be a circuit that includes, for example, a p-channel metal-oxide semiconductor (PMOS) transistor, which is driven by the first power supply voltage VEXT and is gated to the second node NB. In the PMOS transistor, the first power supply voltage VEXT is connected to a source, the second node NB is connected to a gate, and a drain outputs the clamp voltage $VREFA_{PRE}$. As to the first switching unit 114, the PMOS transistor may be turned on in response to the voltage of the second node NB corresponding to the logic low level. The first power supply voltage VEXT is supplied through the turned-on PMOS transistor to thus increase the level of the clamp voltage $VREFA_{PRE}$. As to the first switching unit 114, the PMOS transistor may be turned off in response to the voltage of the second node NB corresponding to a logic high level. The turned-off PMOS transistor does not increase the level of the clamp voltage $VREFA_{PRE}$ because it cuts off the supply of the first power supply voltage VEXT.

Between the clamp voltage $VREFA_{PRE}$ and a ground voltage VSS may be connected the first level control unit 115, also referred to as the first level voltage regulator circuit 115, in which a first resistor 116 and a second resistor 118 may be connected in series. A connection node between the first resistor 116 and the second resistor 118 is the first node NA. Due to operations of the first comparing unit 112 and the first switching unit 114 included in the clamp regulator 110, the voltage of the first node NA becomes almost equal to the first voltage VREF (e.g., the voltage of the first node NA is configured to converge toward the first voltage VREF). Thus, the clamp voltage $VREFA_{PRE}$ may be determined by a resistance R1 of the first resistor 116 and a resistance R2 of the second resistor 118 as below.

$$VREFA_{PRE} = VREF\left(\frac{R1 + R2}{R2}\right) \quad (1)$$

Accordingly, the level of the clamp voltage $VREFA_{PRE}$ may be regulated to have a certain value in relation to VREF by adjusting the resistance R1 of the first resistor 116 and the resistance R2 of the second resistor 118. The clamp voltage $VREFA_{PRE}$ may be set to a minimum voltage level which results in a successful cell restore operation when data is written to a memory cell MC connected to a bit line BL of the DRAM. The clamp voltage $VREFA_{PRE}$ may be regulated to, for example, about 1.08 V.

The level amplifier 120 may be a voltage regulator circuit that include a second comparing unit 122, a second switching unit 124, and a second level control unit 125. The second comparing unit 122 is driven by the second power supply voltage VPPE, and compares the clamp voltage $VREFA_{PRE}$ with a voltage of a third node NC to output a voltage of a fourth node ND. The second power supply voltage VPPE may be set to have a higher level than the level of the first power supply voltage VEXT. For example, when the first power supply voltage VEXT is about 1.2 V, the second power supply voltage VPPE may be, for example, about 1.6 V. The second comparing unit 122 may include circuit elements that form a comparator, and thus may be referred to herein as a comparator circuit.

The second comparing unit 122 may output a logic low level to the fourth node ND if the voltage of the third node NC is lower than the clamp voltage $VREFA_{PRE}$. The second comparing unit 122 may output a logic high level to the fourth node ND if the voltage of the third node NC is higher than the clamp voltage $VREFA_{PRE}$. The fourth node ND may be connected with the second switching unit 124.

The second switching unit 124 may be a circuit that includes, for example, a PMOS transistor that is driven by the second power supply voltage VPPE and is gated to the fourth node ND. In the PMOS transistor, the second power supply voltage VPPE is connected to a source, the fourth node ND is connected to a gate, and a drain outputs the reference voltage VREFA. As to the second switching unit 124, the PMOS transistor may be turned on in response to the voltage of the fourth node ND corresponding to the logic low level. The second power supply voltage VPPE is supplied through the turned-on PMOS transistor, to thus increase the level of the reference voltage VREFA. As to the second switching unit 124, the PMOS transistor may be turned off in response to the voltage of the fourth node ND corresponding to a logic high level. The turned-off PMOS transistor does not increase the level of the reference voltage VREFA, because it cuts off the supply of the second power supply voltage VPPE.

Between the reference voltage VREFA and the ground voltage VSS may be connected the second level control unit 125, also referred to as the second level voltage regulator circuit 115, in which a third resistor 126 and a fourth resistor 128 may be connected in series. A connection node between the third resistor 126 and the fourth resistor 128 is the third node NC. Due to operations of the second comparing unit 122 and the second switching unit 124 included in the level amplifier 120, the voltage of the third node NC becomes almost equal to the clamp voltage $VREFA_{PRE}$. Thus, the reference voltage VREFA may be determined by a resistance R3 of the third resistor 126 and a resistance R4 of the fourth resistor 128 as below.

$$VREFA = VREFA_{PRE}\left(\frac{R3 + R4}{R4}\right) \quad (2)$$

Accordingly, the level of the reference voltage VREFA may be regulated to have a certain value by adjusting the level of the clamp voltage $VREFA_{PRE}$, the resistance R3 of the third resistor 126, and the resistance R4 of the fourth resistor 128. The reference voltage VREFA may be generated to be, for example, about 1.2 V when the clamp voltage $VREFA_{PRE}$ is, for example, about 1.08 V. The level amplifier 120 receives the clamp voltage $VREFA_{PRE}$ to generate the reference voltage VREFA, and a gain thereof may be calculated as about 1.2/1.08. In this example, the reference voltage VREFA may be regulated to be about the same as the reference voltage VREF, so that the reference voltage VREF is maintained even if the external voltages VEXT and/or VPPE are lowered.

Figure 2:
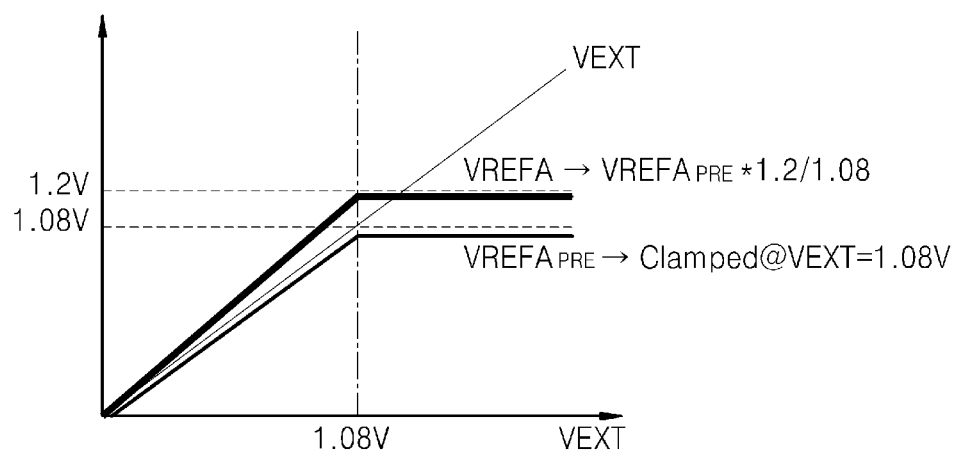
FIG. 2 is a graph for describing an exemplary operation of a reference voltage generator of FIG. 1, according to one embodiment.

FIG. 2 is a graph for describing an operation of the reference voltage generator 100 of FIG. 1.

Referring to FIG. 2, the level of the clamp voltage $VREFA_{PRE}$ and the level of the reference voltage VREFA generated according to the level of the first power supply voltage VEXT are shown. The clamp voltage $VREFA_{PRE}$ is generated almost equal to the first power supply voltage VEXT along with the increase of the first power supply voltage VEXT, and then is clamped at about 1.08 V. The reference voltage VREFA is generated to have a voltage level which is a product of the clamp voltage $VREFA_{PRE}$ and the gain of the level amplifier 120, 1.2/1.08, as below.

$$VREFA = VREFA_{PRE} * \frac{1.2}{1.08} \quad (3)$$

Figure 3:
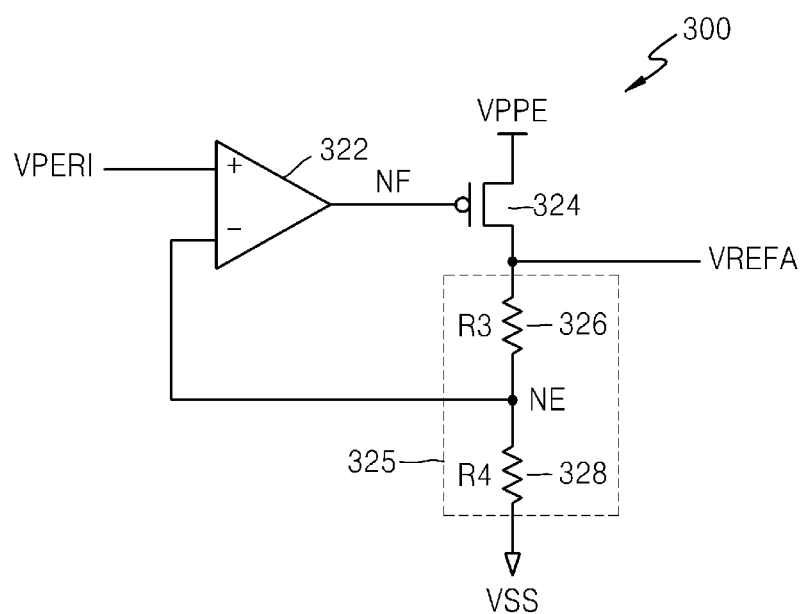
FIG. 3 is a diagram for describing a reference voltage generator according to a second exemplary embodiment.

FIG. 3 is a diagram for describing a reference voltage generator 300 according to a second exemplary embodiment.

Referring to FIG. 3, the reference voltage generator 300 is driven by the second power supply voltage VPPE and receives a second voltage VPERI to generate the reference voltage VREFA. The second power supply voltage VPPE may be set to have a higher level than the first external power supply voltage VEXT which is an external power supply voltage, as described above with reference to FIG. 1. For example, if the first external power supply voltage VEXT is about 1.2 V, the second power supply voltage VPPE may be set to be about 1.6 V.

The reference voltage generator 300 may be included in a semiconductor memory device, for example, a DRAM. The DRAM may roughly include a core block and peripheral circuit blocks. The core block refers to a block including a DRAM cell array and the peripheral circuit blocks refer to the remaining blocks other than the core block. The second voltage VPERI may be one of the voltages used in the peripheral circuit blocks of the DRAM. The second voltage VPERI may be set to be, for example, about 1.08 V. In one embodiment, the second voltage VPERI is set based on a first external power supply voltage VEXT.

The reference voltage generator 300 may include a comparing unit 322, a switching unit 324, and a level regulator circuit, or control unit 325. The comparing unit 322 is driven by the second power supply voltage VPPE and includes a circuit, such as a comparator, configured to compare the second voltage VPERI with a voltage of a first node NE to output a voltage of a second node NF. The comparing unit 322 may output a logic low level to the second node NF if the voltage of the first node NE is lower than the second voltage VPERI. The comparing unit 322 may output a logic high level to the second node NF if the voltage of the first node NE is higher than the second voltage VPERI. The second node NF may be connected with the switching unit 324.

The switching unit 324 may be a circuit that includes, for example, a PMOS transistor which is driven by the second power supply voltage VPPE and is gated to the second node NF. In the PMOS transistor, the second power supply voltage VPPE is connected to a source, the second node NF is connected to a gate, and a drain outputs the reference voltage VREFA. As to the switching unit 324, the PMOS transistor may be turned on in response to the voltage of the second node NF corresponding to the logic low level. The second power supply voltage VPPE is supplied through the turned-on PMOS transistor to thus increase the level of the reference voltage VREFA. As to the switching unit 324, the PMOS transistor may be turned off in response to the voltage of the second node NF corresponding to a logic high level. The turned-off PMOS transistor does not increase the level of the reference voltage VREFA because it cuts off the supply of the second power supply voltage VPPE.

Between the reference voltage VREFA and the ground voltage VSS may be connected the level regulator circuit 325 in which a first resistor 326 and a second resistor 328 may be connected in series. A connection node between the first resistor 326 and the second resistor 328 is the first node NE. Due to operations of the comparing unit 322 and the switching unit 324, the voltage of the first node NE becomes almost equal to the second voltage VPERI. Thus, the reference voltage VREFA may be determined by a resistance R3 of the first resistor 326 and a resistance R4 of the second resistor 328 as below.

$$VREFA = VPERI\left(\frac{R3 + R4}{R4}\right) \quad (4)$$

Accordingly, the level of the reference voltage VREFA may be regulated by adjusting the level of the second voltage VPERI, the resistance R3 of the first resistor 326, and the resistance R4 of the second resistor 328. The reference voltage VREFA may be generated to be, for example, about 1.2 V when the second reference voltage VPERI is, for example, about 1.08 V.

Figure 4:
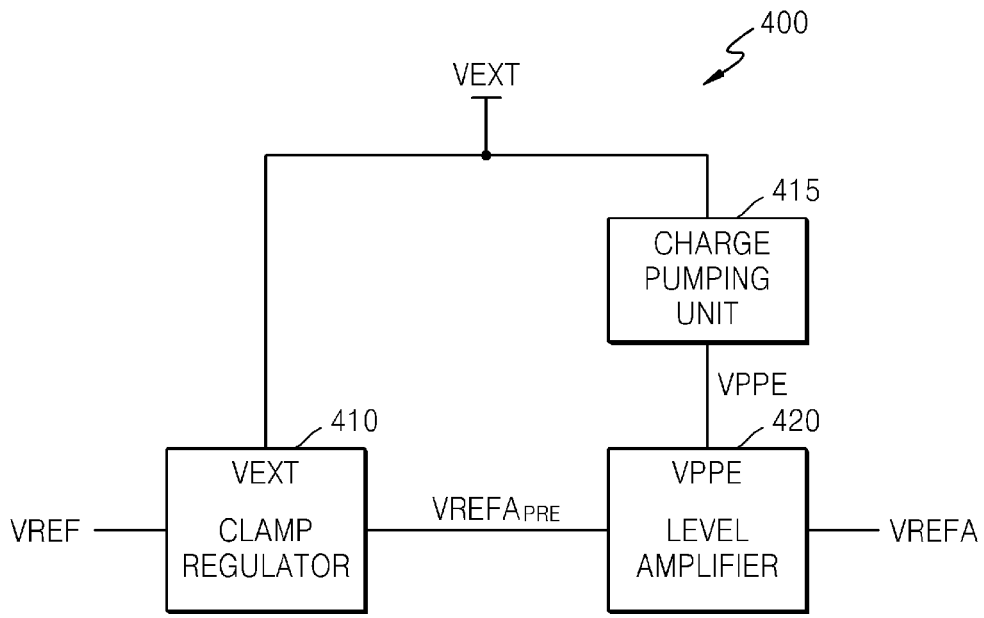
FIG. 4 is a diagram for describing a reference voltage generator according to a third exemplary embodiment.

FIG. 4 is a diagram for describing a reference voltage generator 400 according to a third embodiment.

Referring to FIG. 4, the reference voltage generator 400 may include a clamp regulator 410, a charge pumping unit 415, and a level amplifier 420. The reference voltage generator 400 is driven by the first power supply voltage VEXT, which is an external power supply voltage, and receives the first voltage VREF to generate the clamp voltage VREFA$_{PRE}$ and the reference voltage VREFA.

The clamp regulator 410 may be structured substantially the same as the clamp regulator 110 described with reference to FIG. 1. To avoid repetitive description, a detailed description of the clamp regulator 410 is not provided. The clamp regulator 410 is driven by the first power supply voltage VEXT of, for example, about 1.2 V, and receives the first voltage VREF of, for example, about 0.75 V to generate the clamp voltage VREFA$_{PRE}$ of, for example, about 1.08 V.

The charge pumping unit 415 receives the first power supply voltage VEXT and outputs the second power supply voltage VPPE of a higher level than that of the first power supply voltage VEXT through a charge pumping operation. If the first power supply voltage VEXT is about 1.2 V, the second power supply voltage VPPE may be set, for example, to be about 1.6 V. The charge pumping unit 415 may include an oscillator and a pumping capacitor. The oscillator generates an oscillating signal and the pumping capacitor generates a pumping voltage from the first power supply voltage VEXT in response to the oscillating signal. The charge pumping unit 415 may include a pumping control unit which stops the charge pumping operation when the pumping voltage reaches a predetermined voltage level. The pumping voltage may be output as the second power supply voltage VPPE.

The level amplifier 420 is driven by the second power supply voltage VPPE and receives the clamp voltage VREFA$_{PRE}$ generated by the clamp regulator 410 to generate the reference voltage VREFA. The level amplifier 420 may be structured substantially the same as the level amplifier 120 described with reference to FIG. 1. To avoid repetitive description, a detailed description of the level amplifier 420 is not provided. The level amplifier 420 is driven by the second power supply voltage VPEE having a level, for example, of about 1.6 V, and in one embodiment, generates the reference voltage VREFA of about 1.2 V when the clamp voltage VREFA$_{PRE}$ is about 1.08 V. The level amplifier 420 receives the clamp voltage VREFA$_{PRE}$ to generate the reference voltage VREFA, and a gain thereof may be calculated as about 1.2/1.08.

Figure 5:
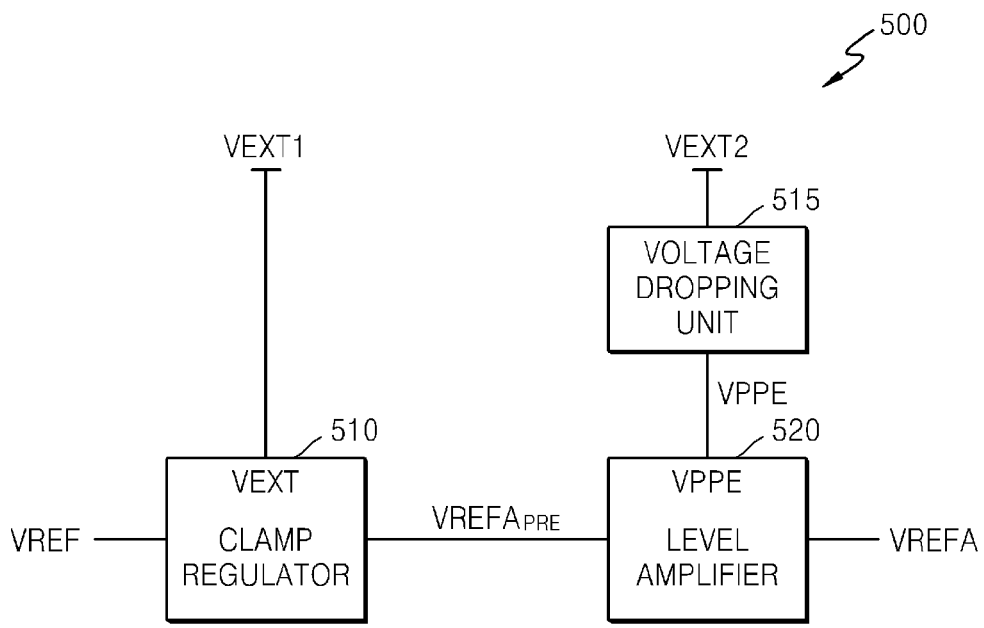
FIG. 5 is a diagram for describing a reference voltage generator according to a fourth exemplary embodiment.

FIG. 5 is a diagram for describing a reference voltage generator 500 according to a fourth embodiment.

Referring to FIG. 5, the reference voltage generator 500 includes a clamp regulator 510, a voltage dropping unit 515, and a level amplifier 520. The reference voltage generator 500 is driven by a first external power supply voltage VEXT1 and a second external power supply voltage VEXT2 and receives the first voltage VREF to generate the clamp voltage VREFA$_{PRE}$ and the reference voltage VREFA. The level of the first external power supply voltage VEXT1 and the level of the second external power supply voltage VEXT2 may be different from each other. The second external power supply voltage VEXT2 may be set to have a higher level than that of the first external power supply voltage VEXT1.

The clamp regulator 510 may be structured substantially the same as the clamp regulator 110 described with reference to FIG. 1. To avoid repetitive description, a detailed description of the clamp regulator 510 is not provided. The clamp regulator 510 is driven by the first external power supply voltage VEXT1 of, for example, about 1.2 V, and receives the first voltage VREF of, for example, about 0.75 V to generate the clamp voltage VREFA$_{PRE}$ of, for example, about 1.08 V.

The voltage dropping unit 515 receives the second external power supply voltage VEXT2 and drops the voltage to output the second power supply voltage VPPE. When the second external power supply voltage VEXT2 is, for example, about 2.5 V, the second power supply voltage VPPE may be set to be, for example, 1.6 V. The voltage dropping unit 515 may include a plurality of diode elements connected in series between the second external power supply voltage VEXT2 and the second power supply voltage VPPE. The diode element causes a voltage drop corresponding to a PN junction forward voltage drop Vf in conduction. For example, for n diode elements, the second power supply voltage VPPE may be determined as VEXT2−n·Vf.

The voltage dropping unit 515 may include a plurality of MOS transistors connected in series between the second external power supply voltage VEXT2 and the second power supply voltage VPPE. In each of the MOS transistors, a gate and a drain thereof may be interconnected. Each of the MOS transistors operates in a diode mode and causes a voltage drop corresponding to a threshold voltage VTN in conduction. For example, for n MOS transistors, the second power supply voltage VPPE may be determined as VEXT2−n·VTN.

The level amplifier 520 is driven by the second power supply voltage VPPE and receives the clamp voltage VREFA$_{PRE}$ generated in the clamp regulator 510 to generate the reference voltage VREFA. The level amplifier 520 may be structured substantially the same as the level amplifier 120 described with reference to FIG. 1. To avoid repetitive description, a detailed description of the level amplifier 520 is not provided. In one embodiment, the level amplifier 520 is driven by the second power supply voltage VPPE of about 1.6 V, and may generate the reference voltage VREFA of about 1.2 V for the clamp voltage VREFA$_{PRE}$ of about 1.08 V. The level amplifier 520 receives the clamp voltage VREFA$_{PRE}$ to generate the reference voltage VREFA, and a gain thereof may be calculated as about 1.2/1.08.

Figure 6:
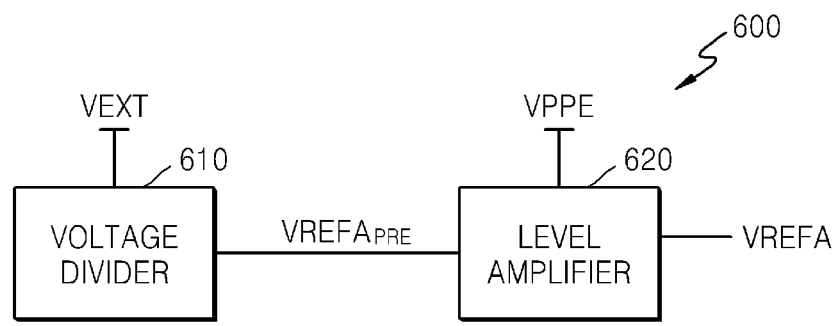
FIG. 6 is a diagram for describing a reference voltage generator according to a fifth exemplary embodiment.

FIG. 6 is a diagram for describing a reference voltage generator 600 according to a fifth embodiment.

Referring to FIG. 6, the reference voltage generator 600 includes a voltage divider 610 and a level amplifier 620. The voltage divider 610 divides a voltage between the first power supply voltage VEXT and the third power supply voltage VSS to generate the clamp voltage VREFA$_{PRE}$. The voltage divider 610 may include a first resistor connected between the first power supply voltage VEXT and the clamp voltage VREFA$_{PRE}$ and a second resistor connected between the clamp voltage VREFA$_{PRE}$ and the third power supply voltage VSS. By adjusting resistances of the first resistor and the second resistor, the level of the clamp voltage VREFA$_{PRE}$ may be regulated. The first power supply voltage VEXT may be, for example, about 1.2 V, and the third power supply voltage VSS may be a ground voltage. The resistances of the first resistor and the second resistor may be adjusted to generate the clamp voltage VREFA$_{PRE}$ of about 1.08 V.

The level amplifier 620 is driven by the second power supply voltage VPPE and receives the clamp voltage VREFA$_{PRE}$ generated by the voltage divider 610 to generate the reference voltage VREFA. The level amplifier 620 may be structured substantially the same as the level amplifier 120 described with reference to FIG. 1. To avoid repetitive description, a detailed description of the level amplifier 420 is not provided. In one embodiment, the level amplifier 620 is driven by the second power supply voltage VPPE of about 1.6 V, and may generate the reference voltage VREFA of about 1.2 V for the clamp voltage VREFA$_{PRE}$ of about 1.08 V. The level amplifier 620 receives the clamp voltage VREFA$_{PRE}$ to generate the reference voltage VREFA, and a gain thereof may be calculated as about 1.2/1.08.

The reference voltage VREFA generated by the reference voltage generators according to various embodiments may serve as a voltage that acts as a criterion for generating internal power supply voltages used in a DRAM.

Figure 7:
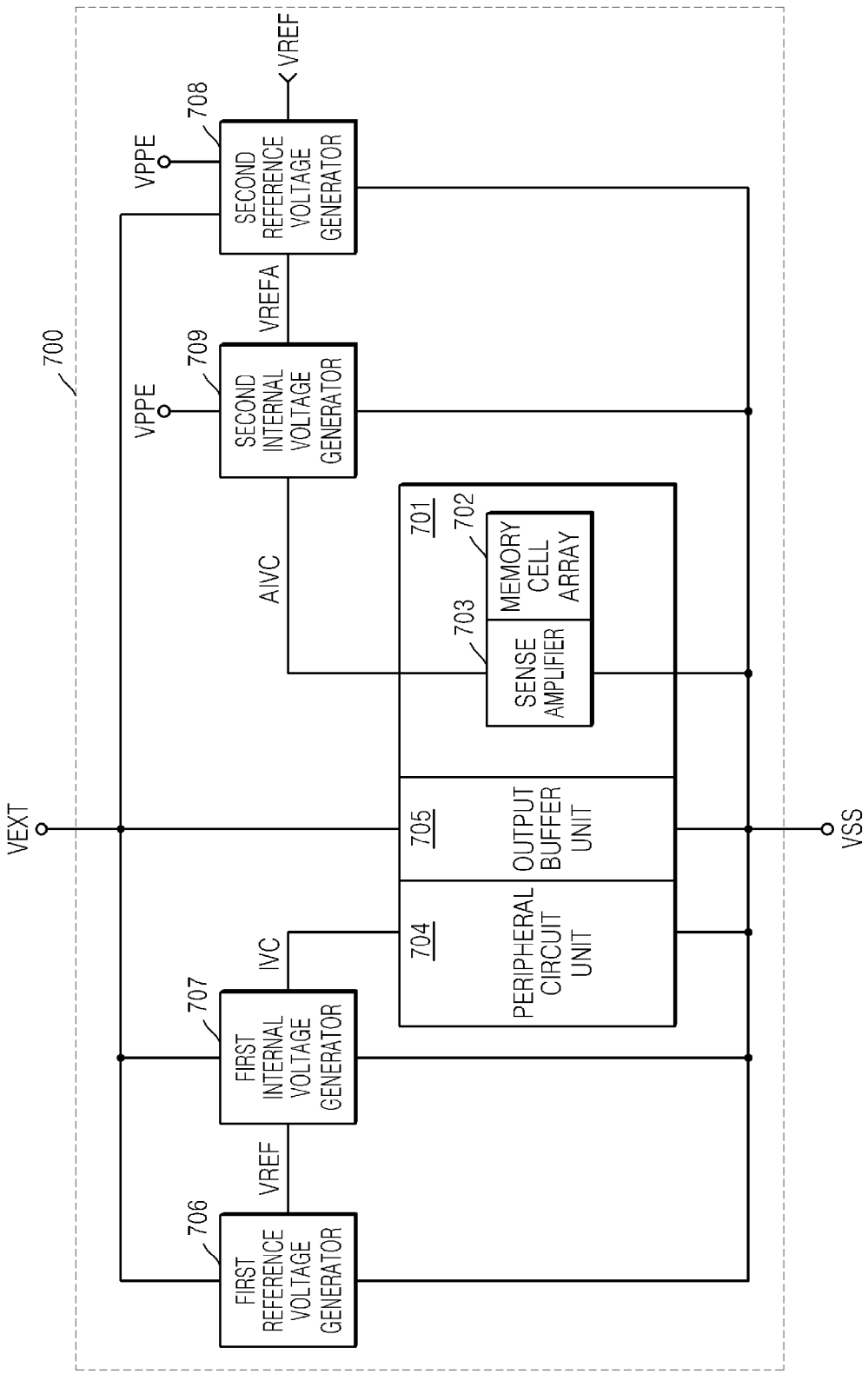
FIG. 7 is a diagram for describing an example of a dynamic random access memory (DRAM) including a reference voltage generator according to various exemplary embodiments.

FIG. 7 is a diagram for describing an example of a DRAM 700 including a reference voltage generator according to various embodiments.

Referring to FIG. 7, the DRAM 700 may include a core block 701 including a memory cell array 702 and a sense amplifier 703, a peripheral circuit unit 704, and an output buffer unit 705. The memory cell array 702 may include a plurality of word lines, a plurality of bit lines intersecting with the plurality of word lines on the plurality of word lines, a plurality of memory cells arranged near intersections between the word lines and the bit lines, a row decoder capable of selecting a predetermined word line among the plurality of word lines, and a column decoder capable of selecting a predetermined bit line among the plurality of bit lines. The sense amplifier 703 may sense-amplify memory cell data read from the plurality of bit lines. The peripheral circuit unit 704 may include an address buffer, a data input buffer, and control circuits. The output buffer unit 705 is driven by the external power supply voltage VEXT and reads out the sense-amplified memory cell data.

The DRAM 700 may include a first reference voltage generator 706, a first internal voltage generator 707, a second reference voltage generator 708, and a second internal voltage generator 709. The first reference voltage generator 706 receives the external power supply voltage VEXT to generate the first reference voltage VREF. The first internal voltage generator 707 is driven by the external power supply voltage VEXT and receives the first reference voltage VREF to generate a first internal power supply voltage IVC. The first internal power supply voltage IVC may be used as a power source for driving the peripheral circuit unit 704.

The second reference voltage generator 708 is driven by the external power supply voltage VEXT and the second power supply voltage VPPE and receives the first reference voltage VREF to generate the second reference voltage VREFA. Like the reference voltage generator 100 described with reference to FIG. 1, the second reference voltage generator 708 may include the clamp regulator 110 and the level amplifier 120. The clamp regulator 110 is driven by the external power supply voltage VEXT and receives the first reference voltage VREF to generate the clamp voltage $VREFA_{PRE}$. The level amplifier 120 is driven by the second power supply voltage VPPE that is higher than the external power supply voltage VEXT and receives the clamp voltage $VREFA_{PRE}$ to generate the second reference voltage VREFA. The second reference voltage generator 708 may be implemented according to one of the embodiments of the reference voltage generators described with reference to FIGS. 3 through 6.

The second internal voltage generator 709 is driven by the second power supply voltage VPPE and receives the second reference voltage VREFA to generate a second internal power supply voltage AIVC. The second internal power supply voltage AIVC may be used as a power source for driving the core block 701.

Figure 8:
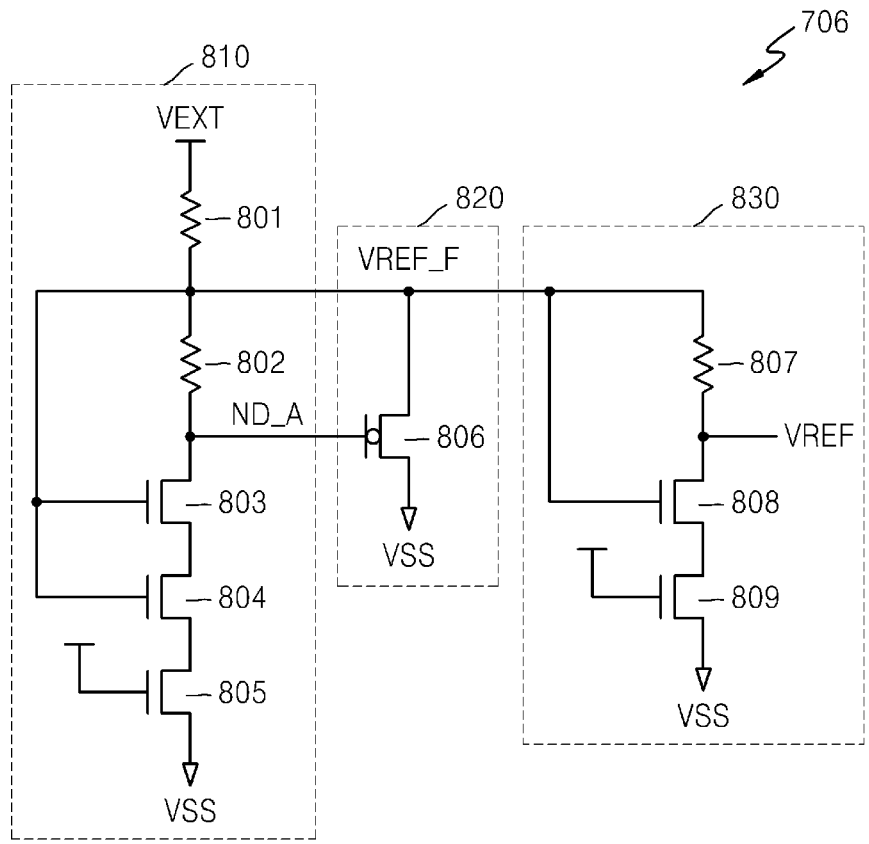
FIG. 8 is an exemplary circuit diagram for describing a first reference voltage generator of FIG. 7, according to one embodiment.

FIG. 8 is a circuit diagram for describing the first reference voltage generator 706 of FIG. 7, according to one exemplary embodiment.

Referring to FIG. 8, the first reference voltage generator 706 may generate the first reference voltage VREF by dividing the external power supply voltage VEXT. The first reference voltage generator 706 may include a bias unit 810, a control unit 820, and a driving unit 830. The bias unit 810 may be a circuit that includes first and second resistors 801 and 802 connected in series between the external power supply voltage VEXT and the ground voltage VSS and first through third n-channel metal-oxide semiconductor (NMOS) transistors 803 through 805. A first-node voltage VREF_F between the first resistor 801 and the second resistor 802 may be connected to gates of the first and second NMOS transistors 803 and 804. The gate of the third NMOS transistor 805 may be connected to the external power supply voltage VEXT. The external power supply voltage VEXT is divided by the first resistor 801, the second resistor 802, and the first through third NMOS transistors 803 through 805, such that the divided voltage may be indicated by the first-node voltage VREF_F.

The control unit 820 may control the first-node voltage VREF_F until the external power supply voltage VEXT is stabilized. The control unit 820 may include a PMOS transistor 806 connected between the first-node voltage VREF_F and the ground voltage VSS. A gate of the PMOS transistor 806 may be connected to a second node ND_A between the second resistor 802 and the first NMOS transistor 803. The PMOS transistor 806 is turned on at an initial stage in which the external power supply voltage VEXT is applied, thus stabilizing the first-node voltage VREF_F to the ground voltage VSS. Thereafter, the PMOS transistor 806 may be turned off if the external power supply voltage VEXT is constantly applied at, for example, about 1.2 V.

The driving unit 830 may generate the first reference voltage VREF in response to the first-node voltage VREF_F. The driving unit 830 may include a third resistor 807 and fourth and fifth NMOS transistors 808 and 809 which are connected in series between the first-node voltage VREF_F and the ground voltage VSS. A gate of the fourth NMOS transistor 808 is connected to the first-node voltage VREF_F, and a gate of the fifth NMOS transistor 809 may be connected to the external power supply voltage VEXT. A voltage of a connection node between the third resistor 807 and the fourth NMOS transistor 808 may be generated as the first reference voltage VREF.

Once the external power supply voltage VEXT increases, the first-node voltage VREF_F increases and the first reference voltage VREF also increases. If the first-node voltage VREF_F increases, the fourth NMOS transistor 808 may be turned on, thus preventing the first reference voltage VREF from increasing.

Once the external power supply voltage VEXT drops, the first-node voltage VREF_F drops and the first reference voltage VREF also drops. If the first-node voltage VREF_F drops, the fourth NMOS transistor 808 may be turned off, thus preventing the first reference voltage VREF from dropping.

Therefore, the first reference voltage generator 706 may stably generate the first reference voltage VREF independently of a change in the external power supply voltage VEXT. The first reference voltage generator 706 may generate the first reference voltage VREF of, for example, about 0.75 V for the external power supply voltage VEXT of about 1.2 V. The first reference voltage VREF may be provided as the first voltage VREF of the reference voltage generators according to various embodiments described with reference to FIGS. 1 and 3 through 5.

Figure 9:
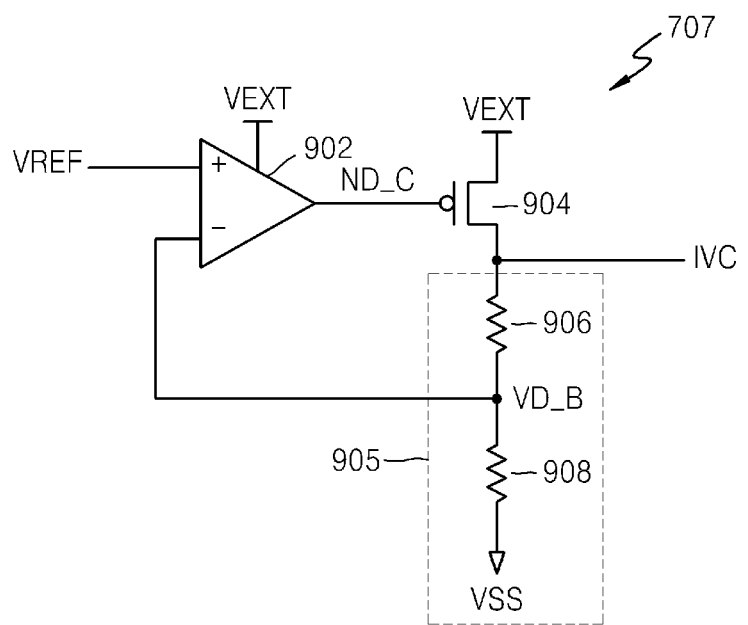
FIG. 9 is an exemplary circuit diagram for describing a first internal voltage generating circuit of FIG. 7, according to one embodiment.

FIG. 9 is a circuit diagram for describing the first internal voltage generator 707 of FIG. 7, according to one exemplary embodiment.

Referring to FIG. 9, the first internal voltage generator 707 is driven by the external power supply voltage VEXT and receives the first reference voltage VREF to generate the first internal power supply voltage IVC. The first internal voltage generator 707 may include circuits that form a comparing unit 902, a switching unit 904, and a level control unit 905. The comparing unit 902 is driven by the external power supply voltage VEXT, compares the first reference voltage VREF with a voltage of a first node ND_B, and outputs a comparison result to a second node ND_C. The external power supply voltage VEXT may be, for example, about 1.2 V, and the first reference voltage VREF may be, for example, about 0.75 V. The comparing unit 902 may output a logic low level to the second node ND_C if the voltage of the first node ND_B is lower than the first reference voltage VREF. The comparing unit 902 may output a logic high level to the second node ND_C if the voltage of the first node ND_B is higher than the first reference voltage VREF. The second node ND_C may be connected with the switching unit 904.

In one embodiment, the switching unit 904 may be a PMOS transistor that is driven by the external power supply voltage VEXT and is gated to the second node ND_C. In the PMOS transistor, the external power supply voltage VEXT is connected to a source, the second node ND_C is connected to a gate, and a drain outputs the internal power supply voltage IVC. The switching unit 904 may turn on the PMOS transistor in response to a voltage of the second node ND_C corresponding to the logic low level. The external power supply voltage VEXT is supplied through the turned-on PMOS transistor, thus increasing the level of the internal power supply voltage IVC. As to the switching unit 904, the PMOS transistor may be turned off in response to the voltage of the second node ND_C corresponding to a logic high level. The turned-off PMOS transistor does not increase the level of the internal power supply voltage IVC, because it cuts off the supply of the external power supply voltage VEXT.

Between the internal power supply voltage IVC and the ground voltage VSS may be connected the level control unit 905 in which a first resistor 906 and a second resistor 908 may be connected in series. A connection node between the first resistor 906 and the second resistor 908 is the first node ND_B. Due to operations of the comparing unit 902 and the switching unit 904, the voltage of the first node ND_B becomes almost equal to the first reference voltage VREF. Thus, the internal power supply voltage IVC may be determined by a resistance of the first resistor 906 and a resistance of the second resistor 908.

Figure 10A:
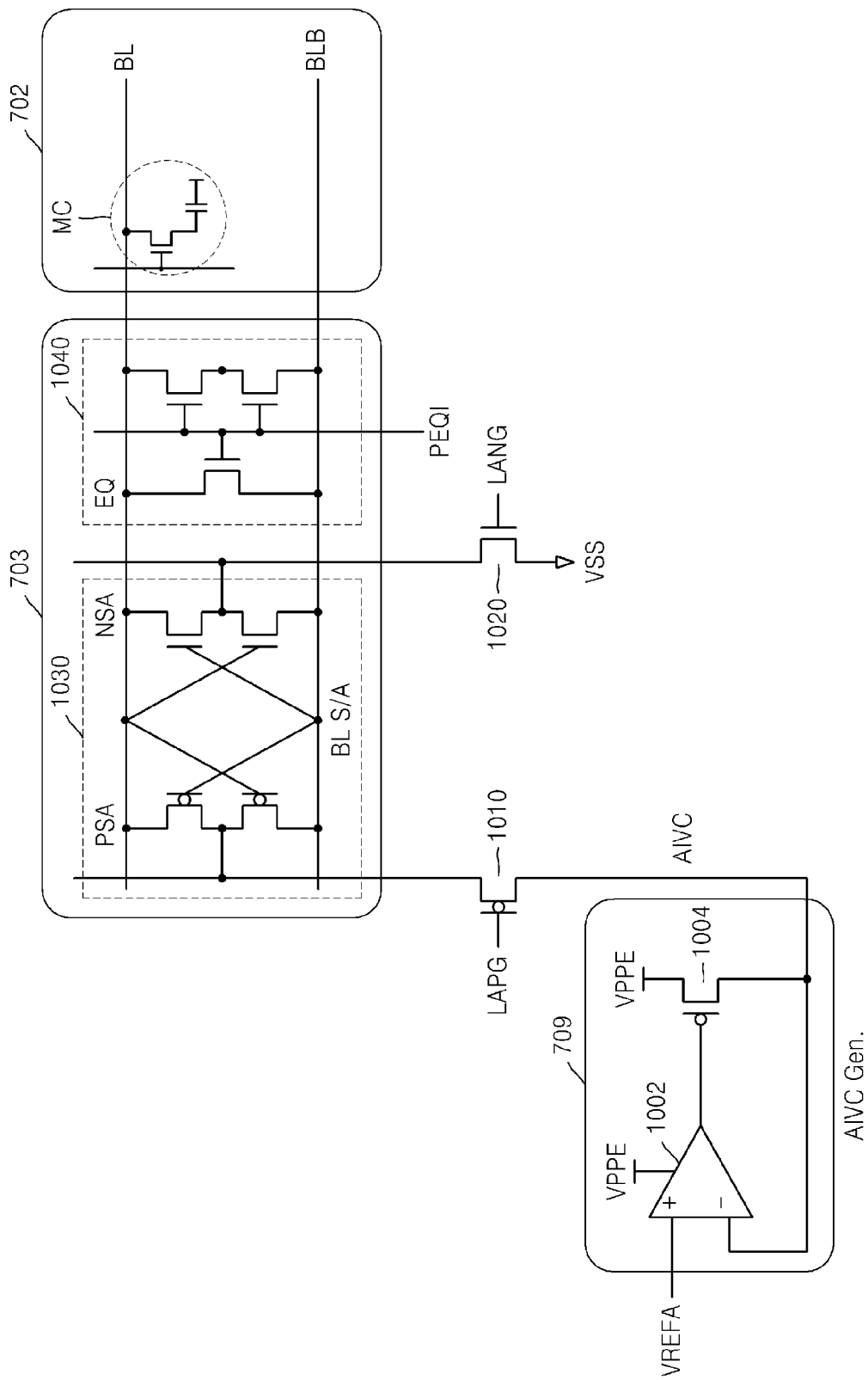
FIG. 10A is an exemplary circuit diagram for describing a second internal voltage generator of FIG. 7 and a sense amplifier of a core block, according to one embodiment.

FIG. 10A is a circuit diagram for describing the second internal voltage generator 709 of FIG. 7 and the sense amplifier 703 of the core block 701, according to one exemplary embodiment.

Referring to FIG. 10A, the second internal voltage generator 709 is driven by the second power supply voltage VPPE and receives the second reference voltage VREFA generated by the second reference voltage generator 708 to generate the second internal power supply voltage AIVC. The second internal voltage generator 709 may include a comparing unit 1002 and a driving unit 1004.

The comparing unit 1002 compares the second reference voltage VREFA with the second internal power supply voltage AIVC and outputs a comparison result. The comparing unit 1002 may output a logic low level if the second internal power supply voltage AIVC is lower than the second reference voltage VREFA. The comparing unit 1002 may output a logic high level if the second internal power supply voltage AIVC is higher than the second reference voltage VREFA. An output of the comparing unit 1002 may be connected with the driving unit 1004.

The driving unit 1004 is driven by the second power supply voltage VPPE and generates the second internal power supply voltage AIVC in response to an output of the comparing unit 1002. The driving unit 1004 may be, for example, a PMOS transistor gated to the output of the comparing unit 1002. In the PMOS transistor, the second power supply voltage VPPE is connected to a source, the output of the comparing unit 1002 is connected to a gate, and a drain outputs the second internal power supply voltage AIVC. As to the driving unit 1004, the PMOS transistor may be turned on in response to the logic low-level output of the comparing unit 1002. The second power supply voltage VPPE is supplied through the turned-on PMOS transistor, thus increasing the level of the second internal power supply voltage AIVC. For the driving unit 1004, the PMOS transistor is turned off in response to the logic high-level output of the comparing unit 1002. The turned-off PMOS transistor does not increase the level of the second internal power supply voltage AIVC because it cuts off the supply of the second power supply voltage VPPE.

Therefore, the second internal voltage generator 709 may generate the second internal power supply voltage AIVC of a level that is almost the same as that of the second reference voltage VREFA. In one embodiment, when the second power voltage VPPE is about 1.6 V and the second reference voltage VREFA generated by the second reference voltage generator 708 is about 1.2 V, the second internal power supply voltage AIVC may be generated at about 1.2 V.

The sense amplifier 703 may include a sensing unit 1030 and an equalizing unit 1040. The sensing unit 1030 may sense-amplify data on a bit line BL and a complementary bit line BLB of the memory cell array 702. The sensing unit 1030 may include a first sensing unit PSA and a second sensing unit NSA connected between the bit line BL and the complementary bit line BLB. The first sensing unit PSA may include PMOS transistors, gates of which are intersected between the bit line BL and the complementary bit line BLB. The second sensing unit NSA may include NMOS transistors, gates of which are intersected between the bit line BL and the complementary bit line BLB. The equalizing unit 703 may include NMOS transistors which are connected between the bit line BL and the complementary bit line BLB and respond to a bit-line equalizing signal PEQI.

The first sensing unit PSA is driven by the second internal power supply voltage AIVC generated by the second internal voltage generator 709, and the second sensing unit NSA is driven by the ground voltage VSS. The second internal power supply voltage AIVC is provided to the first sensing unit PSA through a first switching unit 1010 which responds to a first enable signal LAPG, and the ground voltage VSS is provided to the second sensing unit NSA through a second switching unit 1020 which responds to a second enable signal LANG.

Figure 10B:
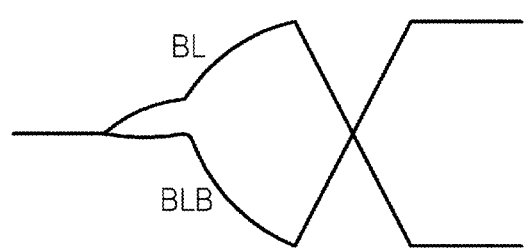
FIG. 10B is an exemplary diagram for describing a data write operation on a bit line of FIG. 10A, according to one embodiment.

The second internal power supply voltage AIVC, which drives the sensing unit 1030, may be an important element for a cell restore operation when data is written to a memory cell MC connected to the bit line BL. In particular, as shown in FIG. 10B, when a previous logic level of the bit line BL and the complementary bit line BLB is inverted and the inverted logic level is written to the memory cell MC, the second internal power supply voltage AIVC needs to maintain a particular voltage level. Even when the level of the external power supply voltage VEXT is lowered to reduce power consumption of the DRAM, the second internal power supply voltage AIVC may be generated constantly at a target voltage level.

The second internal voltage generator 709 may generate the second internal power supply voltage AIVC, which is almost the same as the second reference voltage VREFA. In one embodiment, even when the first reference voltage VREF is generated at about 0.75 V due to lowering of the external power supply voltage VEXT to about 1.2 V, the second reference voltage generator 708 may generate the clamp voltage $VREFA_{PRE}$ of about 1.08 V which is higher than the first reference voltage VREF. The level of the clamp voltage $VREFA_{PRE}$ may be set to a minimum voltage level which results in a successful cell restore operation when data is written to the memory cell MC connected to the bit line BL of the DRAM. The second reference voltage generator 708 may generate the second reference voltage VREFA of about 1.2 V by using the clamp voltage $VREFA_{PRE}$. Thus, the second internal power supply voltage AIVC may be generated at a target voltage level of about 1.2 V which results in a successful cell restore operation. Regardless of the level of the external power supply voltage VEXT, the second internal power supply voltage AIVC of the target voltage (e.g., 1.2 V) may secure a refresh time in a situation where the cell capacitance of the memory cell MC decreases.

Figure 11:
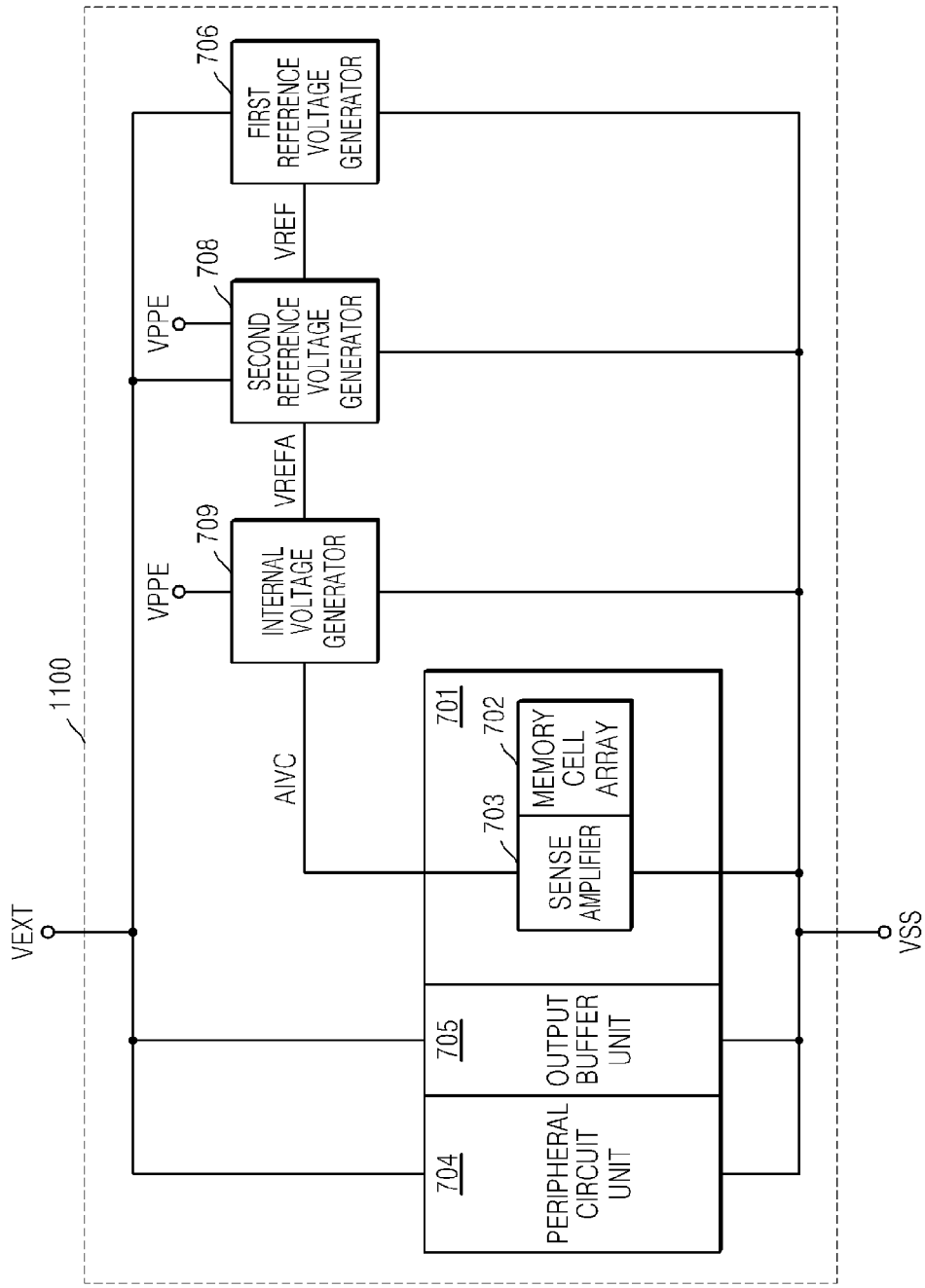
FIG. 11 is a diagram for describing another example of a DRAM including a reference voltage generator according to various exemplary embodiments.

FIG. 11 is a diagram for describing another example of a DRAM 1000 including a reference voltage generator according to various embodiments.

Referring to FIG. 11, the DRAM 1100 may include the core block 701 including the memory cell array 702 and the sense amplifier 703, the peripheral circuit unit 704, the output buffer unit 705, the first reference voltage generator 706, and the second reference voltage generator 708. The DRAM 1100 may include a single internal voltage generator 709 which may be structured substantially the same as the second internal voltage generator 709 of FIG. 7. However, unlike the DRAM 700 of FIG. 7, the DRAM 1100 does not include the first internal voltage generator 707 that drives the peripheral circuit unit 704.

To satisfy the low-consumption power characteristics of the DRAM 1100, the external power supply voltage VEXT may be lowered to, e.g., 1.2 V or lower. In this case, the peripheral circuit unit 704 and the output buffer unit 705 may be configured to be connected to the lowered external power supply voltage VEXT and may be driven by VEXT. The peripheral circuit unit 704 may include, for example, an address buffer, a data input buffer, and control circuits. The output buffer unit 705 is driven by the external power supply voltage VEXT and reads out the sense-amplified memory cell data.

The first reference voltage generator 706 receives the external power supply voltage VEXT and generates the first reference voltage VREF. The second reference voltage generator 708 is driven by the external power supply voltage VEXT and the second power supply voltage VPPE and receives the first reference voltage VREF to generate the second reference voltage VREFA.

Like the reference voltage generator 100 described with reference to FIG. 1, the second reference voltage generator 708 may include the clamp regulator 110 and the level amplifier 120. The clamp regulator 110 is driven by the external power supply voltage VEXT and receives the first reference voltage VREF to generate the clamp voltage $VREFA_{PRE}$. In one embodiment, even when the first reference voltage VREF is generated at 0.75 V or lower due to lowering of the external power supply voltage VEXT to 1.2 V or lower, the second reference voltage generator 708 may generate the clamp voltage $VREFA_{PRE}$ of about 1.08 V which is higher than the first reference voltage VREF. The level of the clamp voltage $VREFA_{PRE}$ may be set to a minimum voltage level which results in a successful a cell restore operation when data is written to the memory cell MC connected to the bit line BL of the DRAM. In one embodiment, the level amplifier 120 is driven by the second power supply voltage VPPE that is higher than the external power supply voltage VEXT, and generates the second reference voltage VREFA of about 1.2 V by using the clamp voltage $VREFA_{PRE}$ of about 1.08 V. The second reference voltage generator 708 may also be implemented, for example, according to one of the embodiments of the reference voltage generators described with reference to FIGS. 3 through 6.

The internal voltage generator 709 is driven by the second power supply voltage VPPE and receives the second reference voltage VREFA to generate the second internal power supply voltage AIVC. The internal voltage generator 709 may generate the second internal power supply voltage AIVC, which is the same as the second reference voltage VREFA. In one embodiment, the second internal power supply voltage AIVC may be generated at about 1.2 V, which is a target voltage level. The second internal power supply voltage AIVC may be used as a power source for driving the core block 701. The second internal power supply voltage AIVC has a target voltage level which results in a successful cell restore operation when data is written to the memory cell MC connected to the bit line BL. The second internal power supply voltage AIVC of about 1.2 V may secure a refresh time of the memory cell MC, regardless of the level of the external power supply voltage VEXT.

Figure 12:
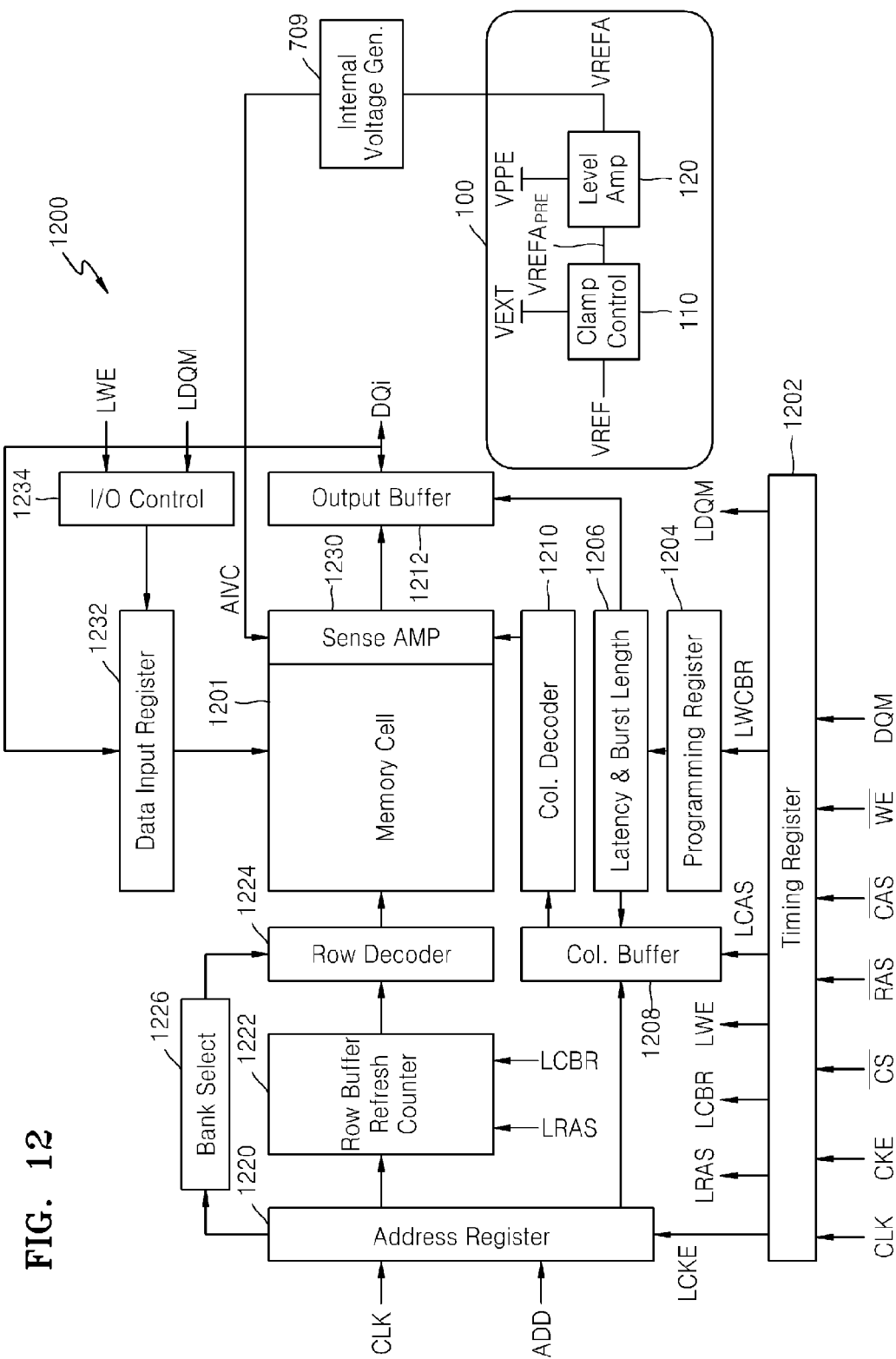
FIG. 12 is a diagram for describing a semiconductor memory device including a reference voltage generator according to various exemplary embodiments.

The reference voltage generators according to the embodiments disclosed herein may be included in a semiconductor memory device shown in FIG. 12, e.g., a double data rate synchronous dynamic random access memory (DDR-SDRAM).

Referring to FIG. 12, a DDR-SDRAM 1200 may include a memory cell array 1201 including DRAM cells and various circuit blocks for driving the DRAM cells. For example, a timing register 1202 may be activated when a chip selection signal CS changes from an inactive level (e.g., logic high) to an active level (e.g., logic low). The timing register 1202 receives a command signal such as a clock signal CLK, a clock enable signal CKE, a chip selection signal CSB, a row address strobe signal RASB, a column address strobe signal CASB, a write enable signal WEB, a data input/output mask signal DQM, etc., processes the received command signal, and generates various internal command signals LRLS, LCBR, LWE, LCAS, LWCBR, and LDQM for controlling the circuit blocks.

Some of the internal command signals generated in the timing register 1202 are stored in a programming register 1204. For example, latency information and burst length information which are associated with data output may be stored in the programming register 1204. The internal command signals stored in the programming register 1204 may be provided to a latency/burst length control unit 1206, which then provides a control signal for controlling latency or burst length of data output to a column decoder 1210 or an output buffer 1212.

An address register 1220 may receive an address signal ADD from an external source. A row address signal may be provided to a row decoder 1224 through a row address buffer 1222. The column address signal may be provided to the column decoder 1210 through a column address buffer 1208. The row address buffer 1222 may further receive a refresh address signal generated from a refresh counter in response to refresh commands LRAS and LCBR, and provide one of the row address signal and the refresh address signal to the row decoder 1224. The address register 1220 may provide a bank signal for selecting a bank to a bank selecting unit 1226.

The row decoder 1224 decodes the row address signal or the refresh address signal input from the row address buffer 1222 and activates a word line of the memory cell array 1201. The column decoder 1210 decodes a column address signal and selects a bit line of the memory cell array 1201. For example, a column selection line is applied to a semiconductor memory device 1200, such that selection through a column selection line may be performed.

A sense-amplifier 1230 amplifies data of a memory cell selected by the row decoder 1224 and the column decoder 1210, and provides the amplified data to the output buffer 1212. Data to be written to a data cell is provided to the memory cell array 1201 through a data input register 1232, and an input/output controller 1234 may control a data forward operation through the data input register 1232.

The reference voltage generator 100, as shown in FIG. 1, may include the clamp regulator 110 and the level amplifier 120. The clamp regulator 110 is driven by the external power supply voltage VEXT and receives the first reference voltage VREF to generate the clamp voltage $VREFA_{PRE}$. In one embodiment, even when the first reference voltage VREF is generated at 0.75 V or lower due to lowering of the external power supply voltage VEXT to 1.2 V or lower, the second reference voltage generator 708 may generate the clamp voltage $VREFA_{PRE}$ of about 1.08 V which is higher than the first reference voltage VREF. The level of the clamp voltage $VREFA_{PRE}$ may be set to a minimum voltage level which results in a successful cell restore operation when data is written to the memory cell MC connected to the bit line BL of the DRAM. In one embodiment, the level amplifier 120 is driven by the second power supply voltage VPPE that is higher than the external power supply voltage VEXT, and generates the second reference voltage VREFA of about 1.2 V by using the clamp voltage $VREFA_{PRE}$ of about 1.08 V. The reference voltage generator 100 may also be implemented according to one of the embodiments of the reference voltage generators described with reference to FIGS. 3 through 6. The second reference voltage VREFA may have a reference voltage level for generation of an internal power supply voltage AIVC, which drives the sense-amplifier 1230 (e.g., through an internal voltage generator 709). The internal power supply voltage AIVC has a target voltage level which results in a successful cell restore operation when data is written to the memory cell MC connected to the bit line BL. In one embodiment, an internal power supply voltage AIVC of about 1.2 V may secure the refresh time of the memory cell MC, irrespective of the level of the external power supply voltage VEXT.

Figure 13:
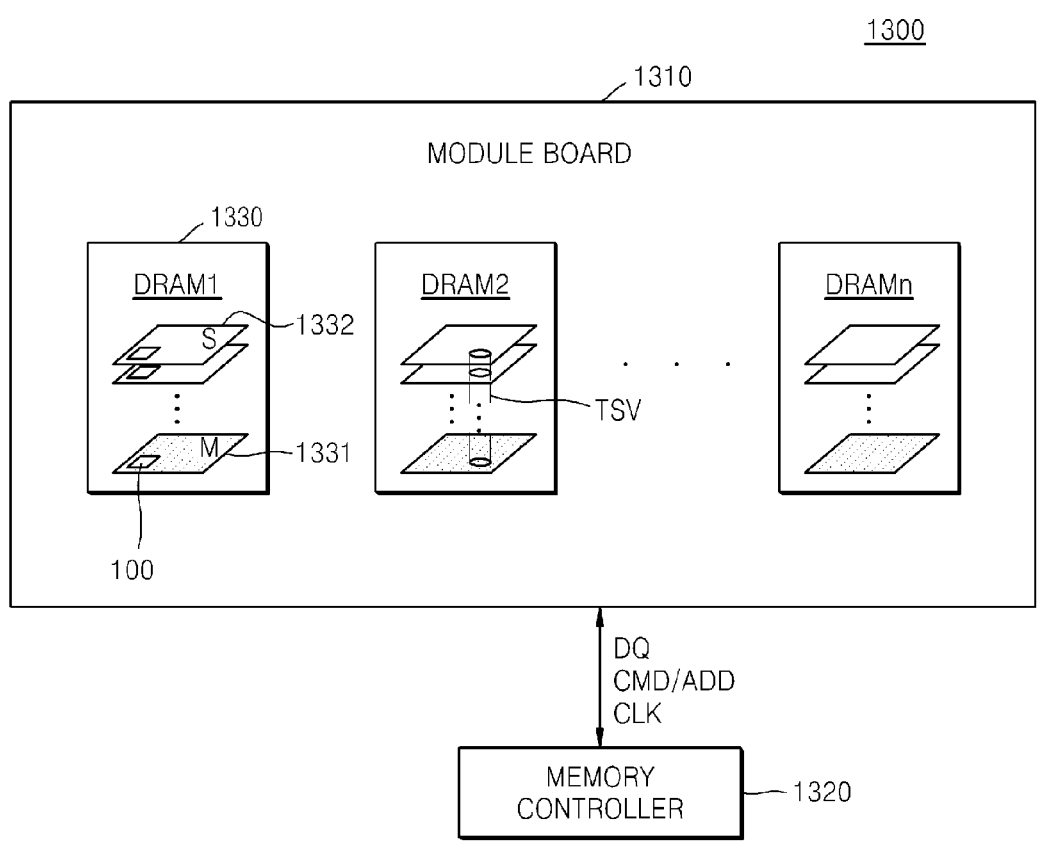
FIG. 13 is a diagram showing an implementation example of a memory system to which a semiconductor memory device of FIG. 12 is applied, according to one embodiment.

FIG. 13 is a diagram showing an implementation example of a memory system 1300 to which the semiconductor memory device of FIG. 12 is applied, according to one embodiment.

Referring to FIG. 13, the memory system 1300 may include a memory module 1310 and a memory controller 1320. The memory module 1310 may include at least one semiconductor memory device 1330 mounted on a module board. The semiconductor memory device 1330 may be implemented, for example, as a DRAM chip, and the semiconductor memory device 1330 may include a plurality of semiconductor layers. The semiconductor layers may include one or more master chips 1331 and one or more slave chips 1332. Signal forwarding between the semiconductor layers may be performed through a through-substrate via, such as a through-silicon via (TSV).

While a structure in which signal forwarding between semiconductor layers is performed through a TSV has been described in the current embodiment, such signal forwarding may also be applied to a structure in which the semiconductor layers are deposited through wire-bonding, interposing, or a wire-formed tape.

Signal forwarding between the semiconductor layers may also be performed through optical input/output (IO) connection. For example, the semiconductor layers may be interconnected by using a radiative type connection using radio frequency (RF) waves or ultrasonic waves, an inductive coupling type connection using magnetic induction, or a non-radiative type connection using magnetic-field resonance.

The radiative type forwards a signal wirelessly by using an antenna such as a monopole antenna or a planar inverted-F antenna (PIFA). Radiation occurs as an electric field or a magnetic field, which changes over time, influences each other, and an antenna having the same frequency, if any, may receive a signal suitably for polarization characteristics of incident waves.

The inductive coupling type generates a strong magnetic field by winding a coil several times, and a coil, which resonates at a similar frequency, is close to the strong magnetic field, thus generating coupling.

The non-radiative type uses evanescent wave coupling which moves electromagnetic waves between two media that resonate at the same frequency through a near electromagnetic field.

The master chip 1331 and the slave chip 1332 may include reference voltage generators according to the various disclosed embodiments. The reference voltage generator may include a clamp regulator and a level amplifier, as shown in FIG. 1. The clamp regulator is driven by the external power supply voltage and receives the first reference voltage to generate the clamp voltage. In one embodiment, even when the first reference voltage is generated at 0.75 V or lower because the external power supply voltage is lowered to 1.2 V or lower, the reference voltage generator may generate the clamp voltage of about 1.08 V, which is higher than the first reference voltage. The clamp voltage level may be set to a minimum voltage level which results in a successful cell restore operation when data is written to the memory cell MC connected to the bit line BL of the DRAM. The level amplifier is driven by the second power supply voltage that is higher than the external power supply voltage, and generates the second reference voltage of, for example, about 1.2 V by using the clamp voltage of, for example, about 1.08 V. The reference voltage generator may be implemented according to one of the embodiments of the reference voltage generators described with reference to FIGS. 3 through 6. The second reference voltage may have a reference voltage level for generation of the internal power supply voltage, which drives the sense-amplifier. The internal power supply voltage has a target voltage level which results in a successful cell restore operation when data is written to the memory cell connected to the bit line. The internal power supply voltage may secure the refresh time of the memory cell MC, irrespective of the level of the external power supply voltage.

The memory module 1310 may communicate with the memory controller 1320 through a system bus. Through the system bus, data DQ, command (CMD)/address (ADD), a clock signal CLK, etc. may be transmitted and received between the memory module 1310 and the memory controller 1320.

Figure 14:
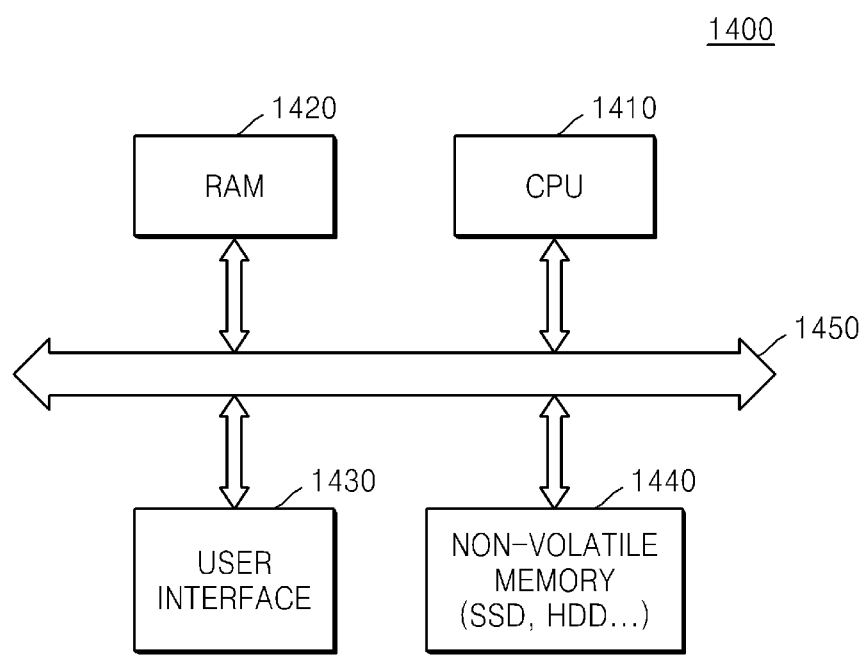
FIG. 14 is a block diagram of a computing system having mounted thereon a memory system according to one exemplary embodiment.

FIG. 14 is a block diagram of a computing system 1400 having mounted thereon a memory system according to an exemplary embodiment.

Referring to FIG. 14, a semiconductor memory device according to one embodiment may be mounted as a RAM 1420 on the computing system 1400 such as a mobile device or a desktop computer. The semiconductor memory device mounted as the RAM 1420 may accord to any one of the aforementioned embodiments. For example, the RAM 1420 may be a semiconductor memory device according to the foregoing embodiments, or may be a memory module. The RAM 1420 may have concept including the semiconductor memory device and the memory controller.

The computing system 1400 according to an exemplary embodiment includes a central processing device (CPU) 1410, the RAM 1420, a user interface 1430, and a non-volatile memory 1440, which are electrically connected to a bus 1450. The non-volatile memory 1440 may be a large-capacity storage device such as a solid-state drive (SSD) or hard disk drive (HDD).

In the computing system 1400, the RAM 1420 may include a reference voltage generator according to the embodiments disclosed herein. The reference voltage generator may include a clamp regulator and a level amplifier, as shown in FIG. 1. The clamp regulator is driven by the external power supply voltage and receives the first reference voltage to generate the clamp voltage. Even when the first reference voltage is generated, for example, at 0.75 V or lower due to lowering of the external power supply voltage, for example, to 1.2 V or lower, the reference voltage generator may generate the clamp voltage, for example, of about 1.08 V, which is higher than the first reference voltage. The clamp voltage level may be set to a minimum voltage level which results in a successful cell restore operation when data is written to the memory cell MC connected to the bit line BL of the DRAM. The level amplifier is driven by the second power supply voltage that is higher than the external power supply voltage, and generates the second reference voltage, for example, of about 1.2 V by using the clamp voltage, for example, of about 1.08 V. The reference voltage generator may be implemented according to one of the various embodiments described with reference to FIGS. 3 through 6. The second reference voltage may have the reference voltage level for generating the internal power supply voltage, which drives the sense-amplifier. The internal power supply voltage has a target voltage level which results in a successful cell restore operation when data is written to the memory cell connected to the bit line. The internal power supply voltage may secure a refresh time of the memory cell regardless of the lowered external power supply voltage level.

While the disclosure has been particularly described with reference to exemplary embodiments thereof, they are merely illustrative and those of ordinary skill in the art will understand that various changes and equivalent other embodiments are also possible. Therefore, the true technical scope of the inventive concept should be defined by the technical spirit of the following claims.

What is claimed is:

1. A reference voltage generator comprising:
   a clamp regulator which is driven by a first external power supply voltage supplied from an external source and is configured to receive a first voltage to generate a clamp voltage; and
   a level amplifier which is driven by a second power supply voltage that is higher than the first power supply voltage and is configured to receive the clamp voltage to generate a reference voltage.

2. The reference voltage generator of claim 1, wherein the reference voltage generator is included in a dynamic random access memory (DRAM), and the clamp voltage is set to have a minimum voltage level which results in a successful restore operation with respect to memory cell data in the DRAM.

3. The reference voltage generator of claim 1, wherein the clamp regulator comprises:
   a first comparing unit which is driven by the first power supply voltage and is configured to compare the first voltage with a voltage of a first node to output a voltage of a second node;
   a first switching unit which is driven by the first power supply voltage and is configured to output the clamp voltage in response to the voltage of the second node; and
   a first level control unit configured to output the voltage of the first node having the same level as a level of the first voltage and regulate a level of the clamp voltage.

4. The reference voltage generator of claim 3, wherein the first switching unit is a p-channel metal-oxide semiconductor (PMOS) transistor in which the first power supply voltage is connected to a source, the second node is connected to a gate, and the clamp voltage is connected to a drain.

5. The reference voltage generator of claim 3, wherein the first level control unit comprises:
   a first resistor connected between the clamp voltage and the second node; and
   a second resistor connected between the second node and a ground voltage.

6. The reference voltage generator of claim 1, wherein the level amplifier comprises:
   a second comparing unit which is driven by the second power supply voltage and is configured to compare the clamp voltage with a voltage of a third node to output a voltage of a fourth node;
   a second switching unit which is driven by the second power supply voltage and is configured to output the reference voltage in response to the voltage of the fourth node; and
   a second level control unit configured to output the voltage of the third node having the same level as a level of the clamp voltage and regulate a level of the reference voltage.

7. The reference voltage generator of claim 6, wherein the second switching unit is a p-channel metal-oxide semiconductor (PMOS) transistor in which the second power supply voltage is connected to a source, the fourth node is connected to a gate, and the reference voltage is connected to a drain.

8. The reference voltage generator of claim 6, wherein the second level control unit comprises:
   a third resistor connected between the reference voltage and the third node; and
   a fourth resistor connected between the third node and the ground voltage.

9. The reference voltage generator of claim 1, further comprising a charge pumping unit for receiving the first power supply voltage, and outputting the second power supply voltage through a charge pumping operation.

10. The reference voltage generator of claim 1, wherein the reference voltage generator further comprises a voltage dropping unit for receiving a third power supply voltage that is higher than the first power supply voltage and dropping the third power supply voltage to output the second power supply voltage.

11. A dynamic random access memory (DRAM) to which a first external power supply voltage is supplied from an external source, the DRAM comprising:
   a comparing circuit which is driven by a second power supply voltage that is higher than the first power supply voltage and is configured to compare a first voltage with a voltage of a first node to generate a voltage of a second node;
   a switching circuit which is driven by the second power supply voltage and is configured to output a reference voltage in response to the voltage of the second node; and
   a level control circuit configured to output the voltage of the first node that converges toward a level of the first voltage and regulate a level of the reference voltage,
   wherein the first voltage is set to have a voltage level which results in a successful restore operation with respect to memory cell data in the DRAM.

12. The DRAM of claim 11, wherein the first voltage is set to have a minimum voltage level which results in a successful restore operation with respect to memory cell data in the DRAM.

13. The DRAM of claim 11, wherein the switching circuit is a p-channel metal-oxide semiconductor (PMOS) transistor in which the second power supply voltage is connected to a source, the second node is connected to a gate, and the reference voltage is connected to a drain.

14. The DRAM of claim 11, wherein the level control circuit comprises:
- a first resistor connected between the reference voltage and the first node; and
- a second resistor connected between the first node and a ground voltage.

15. A dynamic random access memory (DRAM) to which a first external power supply voltage is supplied from an external source, the DRAM comprising:
- a voltage divider for dividing a voltage between the first external power supply voltage and a ground voltage to generate a clamp voltage; and
- a level amplifier which is driven by a second power supply voltage that is higher than the first power supply voltage and configured to receive the clamp voltage to generate a reference voltage,
- wherein the clamp voltage is set to have a minimum voltage level which results in a successful restore operation with respect to memory cell data in the DRAM.

16. The DRAM of claim 15, wherein the voltage divider comprises:
- a first resistor connected between the first power supply voltage and the clamp voltage; and
- a second resistor connected between the clamp voltage and the ground voltage.

17. The DRAM of claim 15, wherein the level amplifier comprises:
- a comparing circuit which is driven by the second power supply voltage and is configured to compare the clamp voltage with a voltage of a first node;
- a switching circuit which is driven by the second power supply voltage and is configured to output the reference voltage in response to a voltage of a second node; and
- a level control circuit configured to output the voltage of the first node having the same level as a level of the clamp voltage and regulate a level of the reference voltage.

18. The DRAM of claim 17, wherein the switching circuit is a p-channel metal-oxide semiconductor (PMOS) transistor in which the second power supply voltage is connected to a source, the second node is connected to a gate, and the reference voltage is connected to a drain.

19. The DRAM of claim 17, wherein the level control circuit comprises:
- a first resistor connected between the reference voltage and the first node; and
- a second resistor connected between the first node and the ground voltage.

20. A reference voltage generator, comprising:
- a voltage regulator connected to an external voltage source and a reference voltage source, and configured to output a regulated voltage determined based on an external voltage input from the external voltage source and the a reference voltage input from the reference voltage source; and
- an amplifier connected to the voltage regulator and a second voltage source, and configured to output an amplified regulated reference voltage determined based on the regulated voltage output from the voltage regulator and a voltage input from the second voltage source,
- wherein the external voltage input to the voltage regulator from the external voltage source has a lower level than the voltage input to the amplifier from the second voltage source.

21. The reference voltage generator of claim 20, wherein: the second voltage source is an external voltage source.

22. The reference voltage generator of claim 20, wherein: the reference voltage generator is configured so that the amplified regulated reference voltage is greater than the regulated voltage output from the voltage regulator and is about the same as the reference voltage.

23. The reference voltage generator of claim 20, wherein the voltage regulator includes:
- a first comparing circuit which is driven by the external voltage and is configured to compare the reference voltage with a voltage of a first node to output a voltage of a second node;
- a first switching circuit which is driven by the external voltage and is configured to output the regulated voltage in response to the voltage of the second node; and
- a first level control circuit configured to output the voltage of the first node having a level that converges to a level of the reference voltage.

* * * * *